METHOD FOR DEPOSITING THIN DIELECTRIC POLYMER FILMS

Filed June 30, 1964

INVENTOR.
ANDREW E. BRENNEMANN
BY
Sughrue, Rothwell, Mion, Zinn & Macpeak
ATTORNEYS

United States Patent Office 3,374,111

Patented Mar. 19, 1968

3,374,111

METHOD FOR DEPOSITING THIN DIELECTRIC POLYMER FILMS

Andrew E. Brennemann, Chappaqua, N.Y., assignor to International Business Machines Corporation, New York, N.Y., a corporation of New York Filed June 30, 1964, Ser. No. 379,151
7 Claims. (Cl. 117—212)

ABSTRACT OF THE DISCLOSURE

Method for the deposition of thin polymeric, insulating films of epoxy resin which adhere tightly to substrate despite extreme thermal shock as encountered in cryogenic devices comprising placing substrate in low pressure chamber, generating monomeric vapors in the chamber by heating a viscous, liquid epoxy material having low vapor pressure, even at the temperature in the chamber, directing the vapors into contact with and condensing them on the substrate, if desired, controlling the pattern of deposition by a mask, and polymerizing the epoxy on the surface of the substrate by impinging charged particles, particularly, an electron beam of 300 to 2,000 electronvolts. The viscous liquid epoxy material undergoes substantially no vaporization under ambient conditions in the vacuum chamber and vaporization of the epoxy is commenced by heating and terminated by discontinuing the heating. Further, the substrate and epoxy source are arranged so that, when the epoxy source is heated, the epoxy vapors are directed towards and primarily deposited on the substrate.

Figure 1:
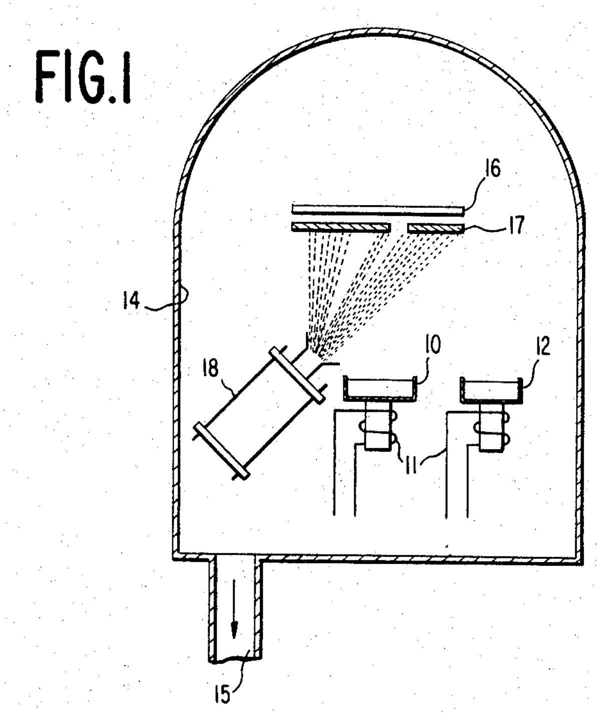

The present invention relates to a method for producing thin polymer, insulating films. In addition, the invention relates to a method for the production of multilayer, thin film electrical devices especially suited for operation in a cryogenic environment.

Processes for producing polymer films by electron bombardment generally well known and have been described in the literature. For example, such processes are described in U.S. Patent 3,119,707, R. W. Christy, issued Jan. 28, 1964, and in the published articles, such as, "Polymerization of Butadiene Gas on Surfaces Under Low Energy Electron Bombardment," by I. Haller and P. White, Journal of Physical Chemistry, vol. 67, 1963, and "Formation of Thin Polymer Films by Electron Bombardment" by R. W. Christy, Journal of Applied Physics, vol. 31, No. 9, September 1960.

For certain applications, however, prior techniques were not found to be entirely satisfactory. Specifically, in the manufacture of multilayer cryogenic circuits, serious difficulties were encountered in the use of known techniques and materials.

Cryogenic multilayer circuit elements generally comprise a series of thin metal films which have a thickness on the order of 5,000 A. and which are separated by thin, insulating films. It is highly desirable, therefore, that the metal and insulating films be capable of being rapidly and alternately deposited to build up the multilayer device. Thus, is it essential for a commercially successful process that the deposition of the conductive layer and the insulating layer be mutually compatible, that the respective layers adhere tenaciously one to the other and that the resulting devices be stable under conditions of use.

It is also desirable that the method for depositing the insulating film should cause no significant contamination of the deposition chamber. Also, the insulating materials should be capable of undergoing controlled, accurate deposition through masks, templates or the like without leaving any substantial, unpolymerized residue.

Therefore, a primary object of the present invention is to provide a method for depositing insulating polymer films in a manner which is fully compatible with the production of multilayer conductive circuit elements.

A particular object of the invention is to provide a method for producing multilayer conductive circuit elements comprising alternate conductive and insulating layers, the circuit elements being useful in cryogenic applications and being capable of withstanding repeated temperature excursions of from 3.0° K. to 273° K. without failure.

The manner in which these and many other highly desirable objects and advantages are achieved according to the present invention will become apparent from the following detailed description of certain preferred embodiments which illustrate the best mode contemplated for practicing the invention.

The nature of the invention will be further appreciated by reference to the accompanying drawing.

Figure 2:
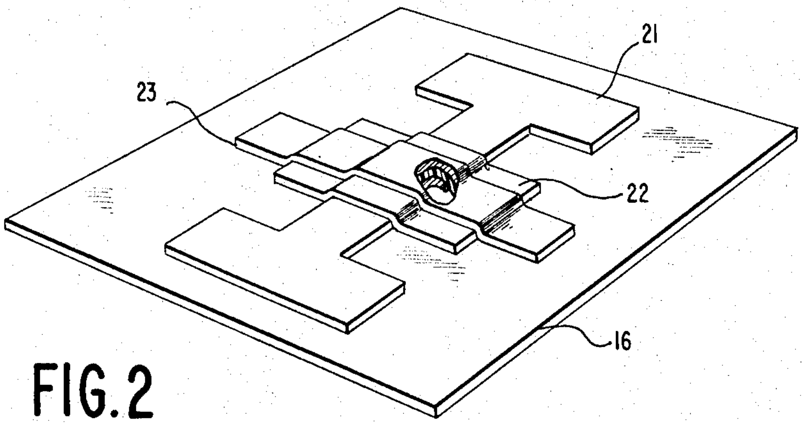

In the drawing:

FIGURE 1 illustrates, in somewhat schematic, side-sectional view, an apparatus useful in practicing the invention, and FIGURE 2 is a perspective, partially broken away view, of a multilayer electrical device produced by the method of the present invention.

According to the invention, a viscous, liquid, uncatalyzed bisphenol A-epichlorohydrin epoxy resin is evaporated and the resulting epoxy vapors are directed into contact with the surface of a substrate which is positioned in a vacuum chamber. Concurrently, the surface of the substrate is bombarded with ions to effect polymerization of the epoxy vapors forming a thin surface film of the polymerized epoxy resin.

The invention further contemplates depositing thin films of polymerized epoxy resin, in the foregoing manner, as insulating films between vacuum deposited conductive layers to provide a multilayer electrical device suitable for use in the cryogenic, super-conducting systems.

The epoxy resin materials useful in the present invention are essentially viscous, liquid resins having low vapor pressures at room temperature and also under the conditions of deposition. The resins are adducts of bisphenol A and epichlorohydrin. An example of the type of epoxy useful in the present process is Eccomold L–28. Thus by utilizing such low vapor pressure epoxy materials, vaporization can be carefully controlled in the low pressure chamber. Substantial vaporization is initiated only by heating above ambient and is quickly terminated by discontinuing the heating.

The conductive layers of the multilayer devices which may be produced by the method may be any metal, metal oxide or other electrically conductive material. Preferably, the conductive layer is capable of vacuum deposition in the same chamber in which the epoxy insulating film is deposited.

In carrying out the deposition of polymerized epoxy insulating films in accordance with the invention, a viscous liquid bisphenol A-epichlorohydrin epoxy resin having a low vapor pressure is heated to generate epoxy vapors at a temperature in the range of from about 60° C. to 150° C. The epoxy vapors are preferably generated within a vacuum deposition chamber in which is positioned the substrate which is to be coated. The temperature of the substrate is preferably maintained at a temperature in the range of from about 15° C. to 30° C.

The epoxy vapors are directed onto the surface of the substrate in the chamber and concurrently the surface is bombarded with an electron beam which has an energy of from about 300 to 2,000 electronvolts and which is operated at a current density of from about 0.05 to 2.5 ma./cm.$^2$ or higher.

The pressure in the vacuum chamber is preferably maintained at from 1 to $5 \times 10^{-5}$ mm. Hg during the deposition.

The resulting condensed, polymerized epoxy layer is a tough film exhibiting essentially bulk epoxy characteristics. The films adhere tenaciously to a wide variety of substrates including glass, metal and plastic. Of great importance is the fact that the electron beam polymerized epoxy films are stable and are very adherent to such substrates over wide temperature ranges, such as are encountered in cryogenic systems. Films having a thickness of about 700 A. or more ordinarily provide extremely effective insulation between the conductive layers of a multilayer electrical device.

It is also important to note that the present method produces little monomer residue in the chamber after polymerization and so deposition of high purity conductive films may be effected rapidly in the same chamber. In addition, the polymer film deposited according to the present invention conforms closely to the desired dimensions as controlled by a mask or screen. This is distinct from polymer deposition by other conventional ion-bombardment methods where creeping around the edges of the mask occurs and an unpolymerized residue is left.

Considering a preferred method for practicing the invention and referring to FIGURE 1 of the drawing for purposes of illustration, a source 10 of epoxy vapors is positioned in vacuum chamber 14 which is evacuated through conduit 15 to maintain a vacuum pressure of from 1 to $5\times10^{-5}$ mm. Hg. The source 10 of epoxy vapors may comprise a boat or vessel containing a viscous liquid bisphenol A-epichlorohydrin, such as Eccomold L-28, which has a low vapor pressure even at the temperatures maintained in chamber 14.

A source 12 of vapors of an electrically conductive material is also positioned in chamber 14. Source 12 may also comprise a boat or vessel containing a material which, upon evaporation, is capable of generating vapors of a conductive material or a material which may later decompose to form a conductive material.

Both sources 10 and 12 are associated with heating means 11 which may comprise a resistance heating coil connected to a suitable source of electrical energy (not shown). Sources 10 and 12 may also be mounted so that first one and then the other may be positioned below substrates 16. In that way, vapors rising from the source which is being operated will impinge on the surface of the substrate. The substrate 16 preferably is an insulating substance, such as glass, plastic or the like.

A mask 17 is interposed between the source 10 (or 12) and the substrate 16.

Means 18 for generating an electron beam and for directing the beam onto the surface of substrate 16 is also positioned in chamber 14.

In the production of a superconducting circuit element of the type shown in FIGURE 2 of the drawing, a first thin film 21 of a conductive substance is vacuum deposited on the surface of substrate 16. The configuration of film 21 is controlled by mask 17. This deposit is formed by positioning source 12 below substrate 16 and by heating to evaporate conductive material under vacuum. The conductive vapors are condensed on the desired portions of substrate 16.

Then deposition of the conductive film is terminated and source 10 is positioned below substrate 16. Another mask 17 is positioned between the substrate and source 10 to control the dimensions of the deposit.

Next, the epoxy in source 10 is heated to generate vapors and the electron beam generating means 18 is actuated to provide an electron beam which impinges on the surface of substrate 16, where not screened by mask 17, concurrently with the condensation of the epoxy vapors. A tough, highly adherent, polymerized epoxy film 22 is thus deposited over conductive layer 21, as shown in FIGURE 2.

As previously noted, the electron beam may have an energy of from 300 to 2,000 electronvolts to polymerize the epoxy resin and is operated at a current density of from 0.5 to 2.5 ma./cm.$^2$ or higher. The form of the electron beam may be such that a narrow rectangular shape beam can be scanned across the substrate or a stationary, defocused or flood-type beam may be employed.

Finally, another conductive layer 23 is deposited over the insulating film 22 in the same manner that the first conductive film 21 was deposited. The sandwich structure formed by the conductive and insulating layers is clearly shown in the broken away portion of FIGURE 2. The device may be completed by the attachment of suitable leads according to conventional practice.

While the present method has been shown and described with reference to certain preferred embodiments, it will be apparent to those skilled in the art that various modifications may be made in the disclosed procedures, apparatus or materials without departing from the spirit of the invention or from the scope of the following claims.

What is claimed is:

1. A method for depositing on a substrate highly adherent, thin, polymeric films capable of withstanding thermal shock conditions as are encountered in the operation of cryogenic devices, comprising the steps of:

positioning a substrate in a low-pressure chamber, generating monomeric vapors by heating a viscous, liquid epoxy resin material in said chamber, said epoxy material having a low vapor pressure at the ambient temperature in said chamber so that there is substantially no vaporization of said epoxy in said chamber without heating of said epoxy, directing vapors of said epoxy material onto said substrate by positioning said substrate in the path of said vapors of epoxy material, and bombarding the surface of said substrate with an electron beam during deposition of said epoxy resin material thereon so as to polymerize said deposited material as a thin film.

2. The method of claim 1 which comprises the further step of maintaining pressures within said chamber at least below $10^{-4}$ mm. of Hg.

3. The method of claim 1 comprising the further step of maintaining said substrate at a constant temperature during bombardment by said electron beam.

4. The method of claim 3 wherein said substrate is maintained at a temperature within the range of 15° C. to 30° C.

5. A method for depositing on a substrate highly adherent thin, polymeric films capable of withstanding thermal shock conditions as are encountered in the operation of cryogenic devices, comprising the steps of:

positioning a substrate within a low pressure chamber, locating a source of viscous, liquid epoxy resin material within said chamber, said epoxy resin material having a low vaporization pressure at the temperature within said chamber, so that there is substantially no vaporization of said epoxy in said chamber without heating of said epoxy, generating monomeric vapors by heating said epoxy resin material within said chamber to form a vapor stream incident on the surface of said substrate, said substrate being positioned in the path of said vapor stream, directing said vapor stream onto said substrate via a mask interposed between said substrate and said epoxy source to restrict the deposition of epoxy to selected areas, exposing the surface of said substrate to a stream of charged particles to induce polymerization of epoxy resin material deposited thereon, and maintaining said substrate at a constant temperature during bombardment by said charged particles.

6. A method for depositing on a substrate highly adherent thin, polymeric films capable of withstanding thermal shock conditions as are encountered in the operation of cryogenic devices, comprising the steps of:

locating a substrate and a source of a liquid, viscous epoxy resin material within a low pressure chamber, said epoxy resin material being an adduct of bisphenol A and epichlorohydrin, and having a low vapor pressure at the temperature in said chamber so that there is substantially no vaporization of said epoxy in said chamber without heating of said epoxy, heating said epoxy resin material to generate monomeric vapors thereof in said chamber, directing said vapor stream onto said substrate via a mask interposed between said substrate and said epoxy source to restrict the deposition of epoxy to selected areas, said mask and substrate being positioned in the path of said vapor stream, condensing said vapors onto the surface of said substrate, and concurrently bombarding the surface of said substrate with an electron beam having an energy of from 300 to 2,000 electronvolts to polymerize said epoxy resin material condensed thereon.

7. A method for producing multilayer electrical devices including thin polymeric insulating films highly adherent to a substrate and capable of withstanding thermal shock conditions as are encountered in the operation of cryogenic devices, comprising the steps of:

vacuum depositing a first thin film of conductive material over at least a portion of the surface of a substrate located within a low-pressure chamber, generating within said chamber monomeric vapors by heating a viscous, liquid epoxy resin material having a low vapor pressure at the temperature within said low-pressure chamber so that there is substantially no vaporization of said epoxy in said chamber without heating of said epoxy, directing said vapors onto the surface of said substrate in a predetermined pattern and over at least a portion of said first thin film, said substrate being positioned in the path of said vapors, bombarding said epoxy resin material while depositing on said substrate by charged particles so as to cause polymerization thereof to form a thin continuous film; and vacuum depositing a second thin film of conductive material on said polymerized epoxy resin material whereby at least a portion of each of said first and second thin films are electrically insulated from one another.

References Cited

UNITED STATES PATENTS 3,119,707 1/1964 Christy ............ 117—93.3

3,297,465 1/1967 Connell et al. ...... 117—93.31

FOREIGN PATENTS 906,324 9/1962 Great Britain.

917,151 1/1963 Great Britain.

ALFRED L. LEAVITT, *Primary Examiner.*

J. H. NEWSOME, *Assistant Examiner.*